(12) United States Patent
Mitani

(10) Patent No.: US 7,875,954 B2
(45) Date of Patent: Jan. 25, 2011

(54) SEMICONDUCTOR CHIP

(75) Inventor: Hitoshi Mitani, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 286 days.

(21) Appl. No.: 12/000,514

(22) Filed: Dec. 13, 2007

(65) Prior Publication Data

US 2008/0142922 A1 Jun. 19, 2008

(30) Foreign Application Priority Data

Dec. 19, 2006 (JP) .............................. 2006/341625

(51) Int. Cl.
*H01L 23/52* (2006.01)
(52) U.S. Cl. ................ 257/529; 257/355; 257/E23.149
(58) Field of Classification Search ................ 257/209, 257/529, 535, E23.149, E23.15, E21.592, 257/355, 356; 438/132, 467, 600, 215, 281, 438/333, 601
See application file for complete search history.

(56) References Cited

U.S. PATENT DOCUMENTS

2007/0029638 A1* 2/2007 Eun ........................... 257/529

FOREIGN PATENT DOCUMENTS

| JP | 62-84521 | 4/1987 |
|----|----------|--------|
| JP | 2-244740 | 9/1990 |
| JP | 10-74838 | 3/1998 |
| JP | 11-163005 | 6/1999 |
| JP | 11-260922 | 9/1999 |
| JP | 2001-189385 | 7/2001 |
| JP | 2005-166900 | 6/2005 |
| JP | 2006-73937 | 3/2006 |
| JP | 2006-80411 | 3/2006 |

OTHER PUBLICATIONS

Yasuhiro Fukuda "Electrostatic Discharge Failure Mechanisms of Semiconductor Devices", Journal of the Institute of Electrostatics Japan, vol. 29, No. 2, 2005, p. 106.

* cited by examiner

*Primary Examiner*—Matthew C Landau
*Assistant Examiner*—Joseph C Nicely
(74) *Attorney, Agent, or Firm*—McGinn IP Law Group, PLLC

(57) ABSTRACT

Provided is a semiconductor chip (1) including: at least one fuse element (21); a fuse opening (17) formed above the fuse element (21); and a discharge electrode (31) that is formed below a bottom portion (17a) of the fuse opening (17), and is formed in one of the same layer with the fuse element (21) and the above layer of the fuse element (21). Accordingly, the current caused to flow due to the electrostatic discharge generated at the time of assembling the semiconductor chip can be discharged through the discharge electrode (31). As a result, the current caused to flow due to the electrostatic discharge generated at the time of assembling the semiconductor chip can be prevented from being discharged through the fuse element, whereby a problem in that a functional failure occurs in the semiconductor chip can be solved.

8 Claims, 16 Drawing Sheets

SEMICONDUCTOR CHIP

BACKGROUND OF THE INVENTION

1. Field of the Invention

The present invention relates to a semiconductor chip, and more particularly, to a semiconductor chip including a redundant circuit having a fuse incorporated therein.

2. Description of the Related Art

As a method of selecting a redundant circuit in a semiconductor integrated circuit, there is employed a method of selecting the redundant circuit by fusing wiring by laser irradiation in many cases. A portion to be fused by laser irradiation (hereinafter, referred to as "fuse element"), which is used in the method, is formed of a conductive layer used as wiring in a semiconductor chip. An interlayer insulating film and a passivation film, which are formed above the fuse element, are to be etched into a predetermined thickness. A region to be opened by the etching (hereinafter, referred to as "fuse opening") is applied with a laser beam, thereby cutting the fuse element formed below the fuse opening.

On the other hand, in a process of sucking a chip diced at the time of assembling the semiconductor chip, the diced semiconductor chip is mounted on a film placed on a push-up stage and is pushed up from a back surface side of the film. After that, the chip is sucked by vacuum suction with a collet made of metal. It is known that, in this case, the semiconductor chip is electrically charged due to frictional static electricity generated between the push-up stage and the film or due to peeling electrification generated between the film and the semiconductor chip, which results in generating electrostatic discharge when the semiconductor chip is brought into contact with the collet made of metal.

In a case where a collet contact portion is formed near a fuse region, the electrostatic discharge is generated through the fuse element and a circuit for selecting a redundant circuit connected to the fuse element, as a discharge path, in some cases. In this case, a current caused to flow through the circuit for selecting a redundant circuit due to the electrostatic discharge causes an operational failure of the circuit for selecting a redundant circuit in some cases. The operational failure occurs in the circuit for selecting a redundant circuit, for example, when a transient large current flows into the circuit to thereby fuse an element provided in the circuit, or when a high electric field is generated between a gate electrode and a semiconductor substrate in the circuit to thereby cause a gate oxide film to be damaged by the electrostatic discharge (for example, see "Electrostatic Discharge Failure Mechanisms of Semiconductor Devices" written by Yasuhiro Fukuda, Journal of the Institute of Electrostatics Japan, Vol. 29, No. 2, 2005, p. 106, and JP 11-163005 A).

In some conventional circuits for selecting a redundant circuit, a wiring layer is formed above the fuse element. However, the wiring layer is not positioned in a region of the fuse opening, and does not function as a protection element (for example, see JP 2005-166900 A, JP 2001-189385 A, JP 11-260922 A, JP 10-74838 A, and JP 62-84521 A).

In a case where the protection element for protecting the circuit against the discharge, which is generated through the fuse element and the circuit for selecting a redundant circuit connected to the fuse element, as a discharge path, is provided in the circuit for selecting a redundant circuit, it is necessary to provide the protection element having resistance equivalent to that of a charged device model (CDM) connected to a bonding pad so that a protection ability of the protection element is ensured. As a result, an area of the protection element becomes large. The area necessary for the protection element is a square region having sides of about 15 μm to 20 μm, for each protection element, while depending on device characteristics and the like.

Further, the protection element associated with the conventional fuse element is electrically connected between the fuse element and an internal circuit, or is connected in parallel with the internal circuit (for example, see JP 02-244740 A and JP 2006-073937 A). In addition, a conductive film is formed on an insulating film so as to be exposed to an inside of the opening of the fuse element, thereby preventing the electrostatic discharge from generating (for example, see JP 2006-080411 A).

FIG. 15 is a plan diagram showing regions in which components are formed on a semiconductor chip of a related art. As shown in FIG. 15, the electrostatic discharge reaches a fuse forming region 120 from a collet contact region 140 on a semiconductor chip 9 in some cases. FIG. 16 is a cross-sectional diagram showing a main part of the semiconductor chip of the related art. As shown in FIG. 16, an electrostatic discharge damage protection element is not provided in the conventional circuit for selecting a redundant circuit, so the current is caused to flow to the circuit for selecting a redundant circuit due to the electrostatic discharge. In FIGS. 15 and 16, the path for the electrostatic discharge is indicated by the bold dashed arrow. Accordingly, the operational failure occurs in the circuit for selecting a redundant circuit in some cases, for example, when a transient large current flows into the circuit along the fuse opening 17 to thereby fuse an element (for example, fuse element 21) provided in the circuit, or when a high electric field is generated between a gate electrode 25 and a semiconductor substrate 11 in the circuit to thereby cause the gate oxide film to be damaged by the electrostatic discharge.

As described above, the current caused to flow due to the electrostatic discharge generated at the time of assembling the semiconductor chip is discharged through the fuse element. As a result, there arises a problem in that a functional failure occurs in the semiconductor chip.

SUMMARY OF THE INVENTION

A semiconductor chip according to the present invention includes: at least one fuse element; a fuse opening formed above the fuse element; and a discharge electrode that is formed below a bottom portion of the fuse opening, and is formed in one of the same layer with the fuse element and the above layer of the fuse element.

Accordingly, the current caused to flow due to the electrostatic discharge generated at the time of assembling the semiconductor chip can be discharged through the discharge electrode. As a result, it is possible to prevent the current caused to flow due to the electrostatic discharge from being discharged through the fuse element, and to prevent a functional failure from occurring in the semiconductor chip.

According to the present invention, the current caused to flow due to the electrostatic discharge generated at the time of assembling the semiconductor chip is prevented from being discharged through the fuse element, thereby preventing a functional failure from occurring in the semiconductor chip.

DETAILED DESCRIPTION OF THE PREFERRED EMBODIMENTS

Figure 1:
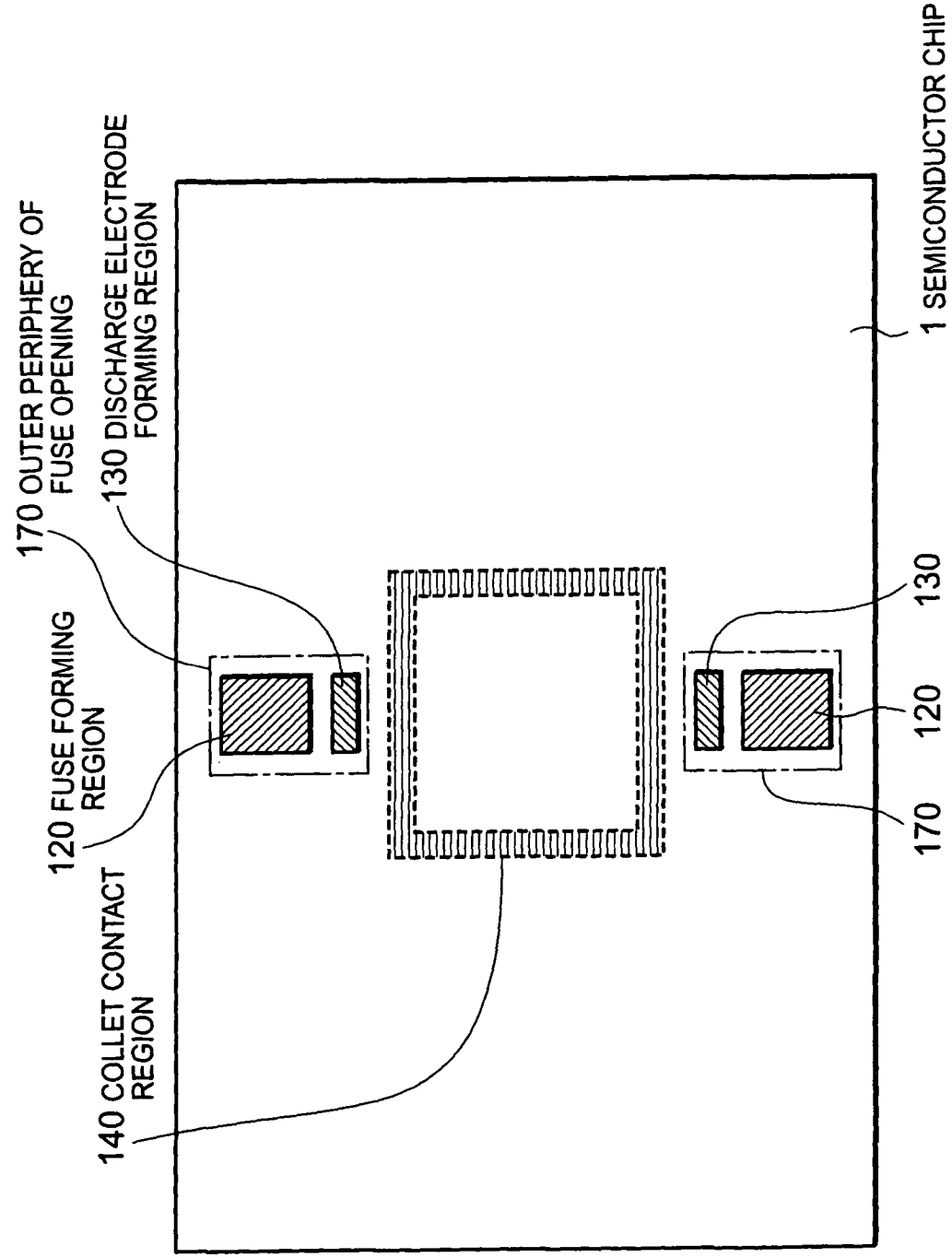
FIG. 1 is a plan diagram showing an example of regions in which components are formed on a semiconductor chip according to Embodiment 1 of the present invention.

Hereinafter, exemplary embodiments of the present invention will be described with reference to the accompanying drawings. In the drawings, components having the same structure or the same function and the corresponding portions are denoted by the same reference symbols, and descriptions thereof are omitted.

Embodiment 1

A structure of a semiconductor chip (semiconductor device) according to Embodiment 1 of the present invention will be described with reference to FIGS. 1 and 2. FIG. 1 is a plan diagram showing an example of regions in which components are formed on a semiconductor chip 1 according to Embodiment 1 of the present invention. In FIG. 1, a fuse forming region 120 in which a fuse element is formed, and a discharge electrode forming region 130 in which a discharge electrode is formed are represented as diagonally shaded regions each surrounded by the solid line (region indicated by forward diagonal lines represents fuse forming region 120 and region indicated by backward diagonal lines represents discharge electrode forming region 130) in the plan diagram of the semiconductor chip 1. Further, an outer periphery 170 of a fuse opening (outer periphery of bottom portion of fuse opening), which is formed on the fuse element, is indicated by the dashed-dotted line. In addition, a collet contact region 140, which is to be brought into contact with a collet, is represented as a horizontal-striped region surrounded by the dashed lines. Unless otherwise stated, the above-mentioned regions are denoted in the same manner in the similar drawings to be used in the following description. In FIG. 1, the discharge electrode forming region 130 is formed between the collet contact region 140 and the fuse forming region 120 on the semiconductor chip 1. The collet contact region 140 holds and carries the semiconductor chip 1, and the collet contact region 140 prevents the semiconductor chip 1 from dropping in assembly process. (the collet contact region 140 called a carrying region)

Figure 2:
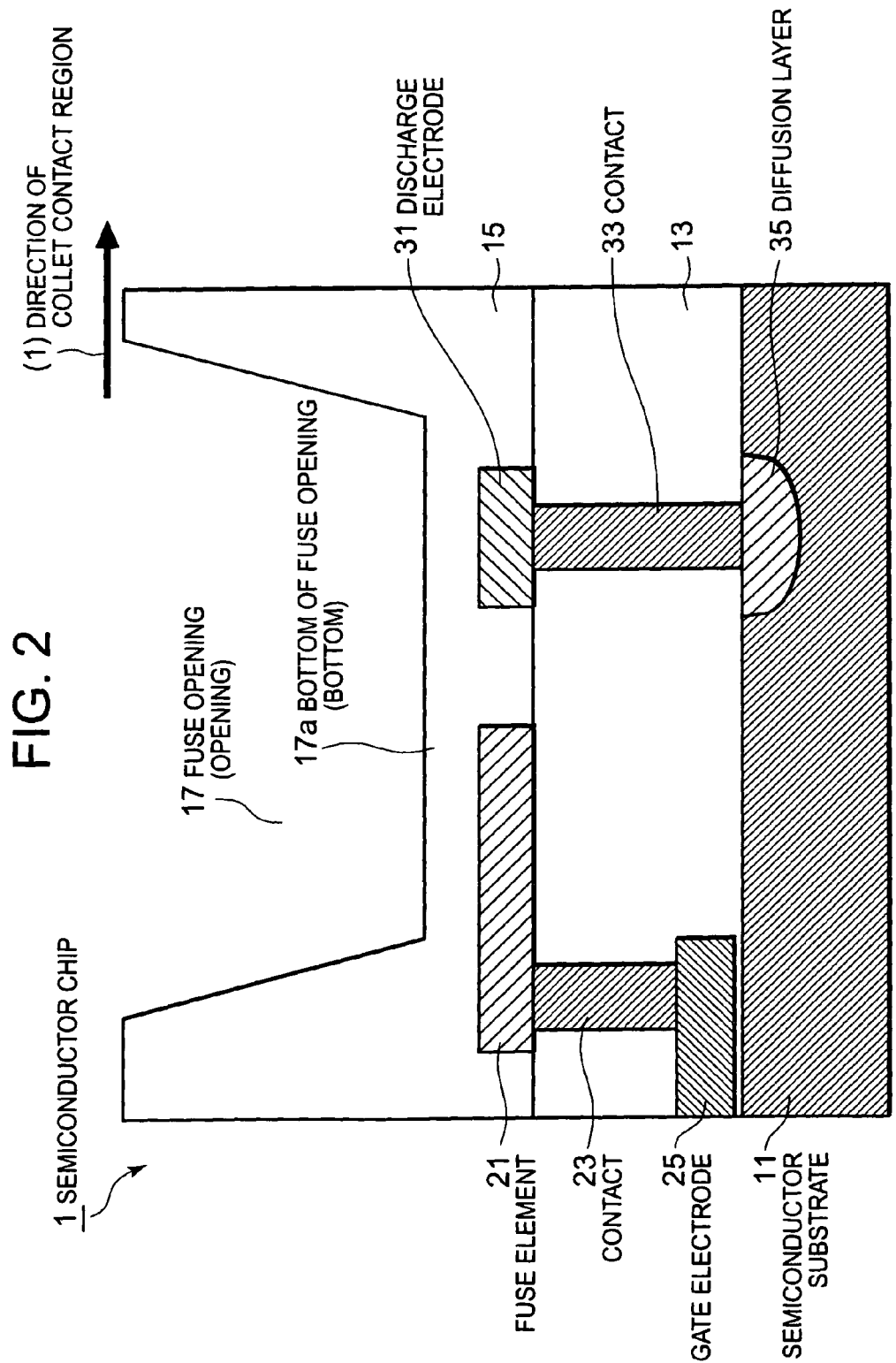
FIG. 2 is a cross-sectional diagram showing an example of a main part of the semiconductor chip according to Embodiment 1 of the present invention.

FIG. 2 is a cross-sectional diagram showing a main part of the semiconductor chip according to Embodiment 1 of the present invention. Specifically, FIG. 2 is a cross-sectional diagram of a portion including a fuse element 21 and a discharge electrode 31 of the semiconductor chip 1. The semiconductor chip 1 shown in FIG. 2 has two wiring layers, that is, interlayer insulating films 13 and 15 formed on a semiconductor substrate 11. Further, a fuse opening 17 is formed above the fuse element 21 in the interlayer insulating film 15. The fuse element 21 and the discharge electrode 31 are formed in the interlayer insulating film 15, and contacts 23 and 33 and a gate electrode 25 are formed in the interlayer insulating film 13. A diffusion layer 35 is formed in the semiconductor substrate 11. Further, in FIG. 2, the collet contact region shown in FIG. 1 is formed in a direction indicated by the arrow.

In FIG. 2, the fuse element 21 is connected to the gate electrode 25 through the contact 23. The gate electrode 25 corresponds a gate of a transistor constituting a part of a circuit for selecting a redundant circuit. The discharge electrode 31 is formed in the wiring layer (interlayer insulating film 15) in which the fuse element 21 is also formed, and is connected to the semiconductor substrate 11 (diffusion layer 35) through the contact 33. The diffusion layer 35 which is in contact with the contact 33 is an impurity diffusion layer of the same type as the semiconductor substrate 11. As a result, the discharge electrode 31 is electrically connected to the semiconductor substrate 11 at the same potential. Further, in the structure, a parasitic resistance component interposed between the semiconductor substrate 11 and the discharge electrode 31 is reduced as much as possible.

As shown in FIG. 1, the discharge electrode forming region 130 is formed in a region that is closer to the collet contact region 140, which is to be brought into contact with the collet, than the fuse forming region 120. When the collet comes into contact with the vicinity of a center of the semiconductor chip 1 (near the center of semiconductor chip 1) and the fuse forming region 120 is formed outside the collet contact region 140 (on a side closer to the outer periphery of semiconductor chip 1), the discharge electrode forming region 130 is formed at a position closer to the center of the semiconductor chip 1 than the fuse forming region 120. This is because a distance between the collet contact region 140 and the discharge electrode forming region 130 is shorter than a distance between the collet contact region 140 and the fuse forming region 120. Accordingly, the current to be discharged from the collet is liable to reach the discharge electrode 31 formed in the discharge electrode forming region 130.

Figure 3:
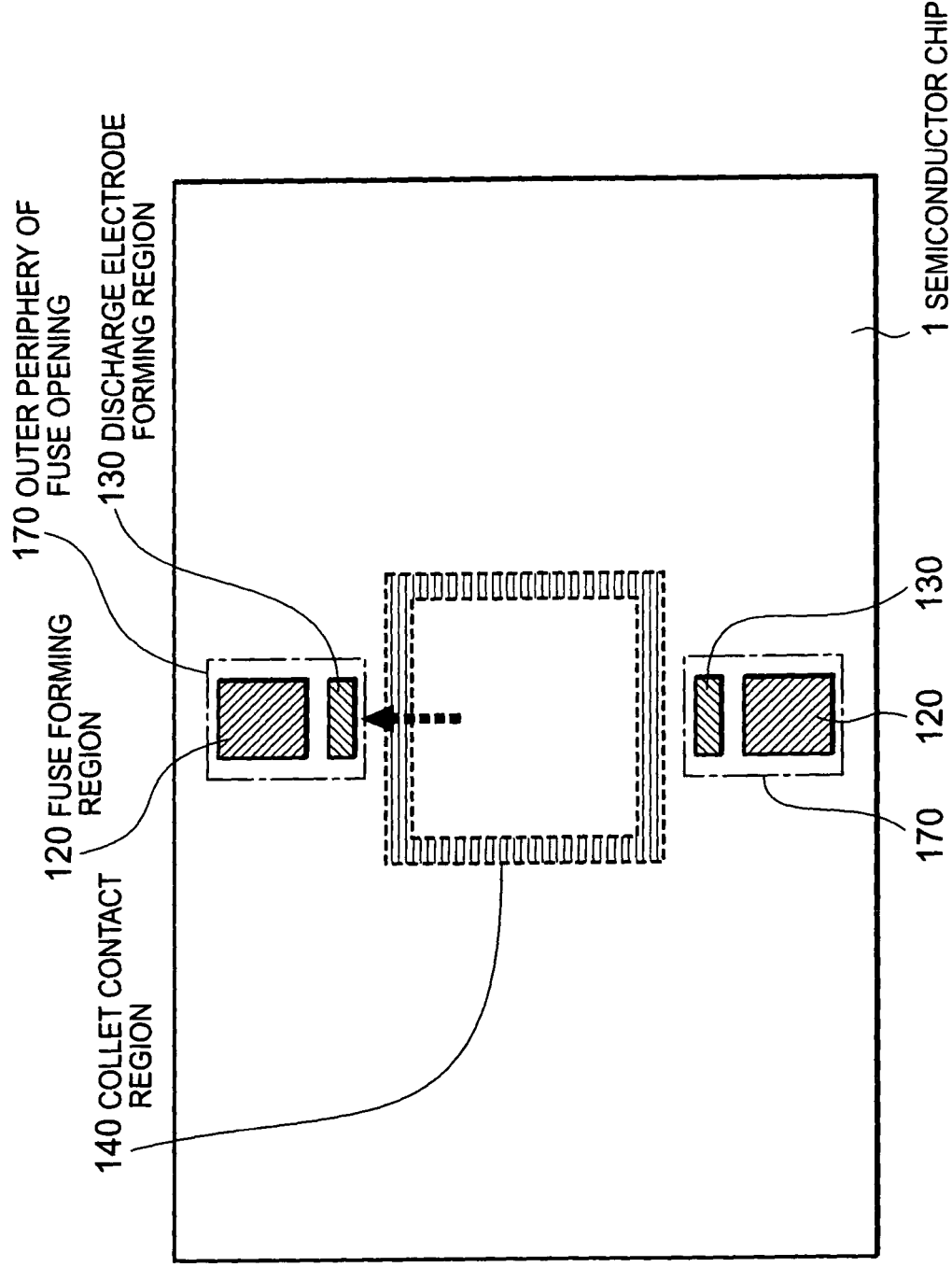
FIG. 3 is a diagram showing a discharge path obtained during a process of sucking the semiconductor chip shown in FIG. 1.
Figure 4:
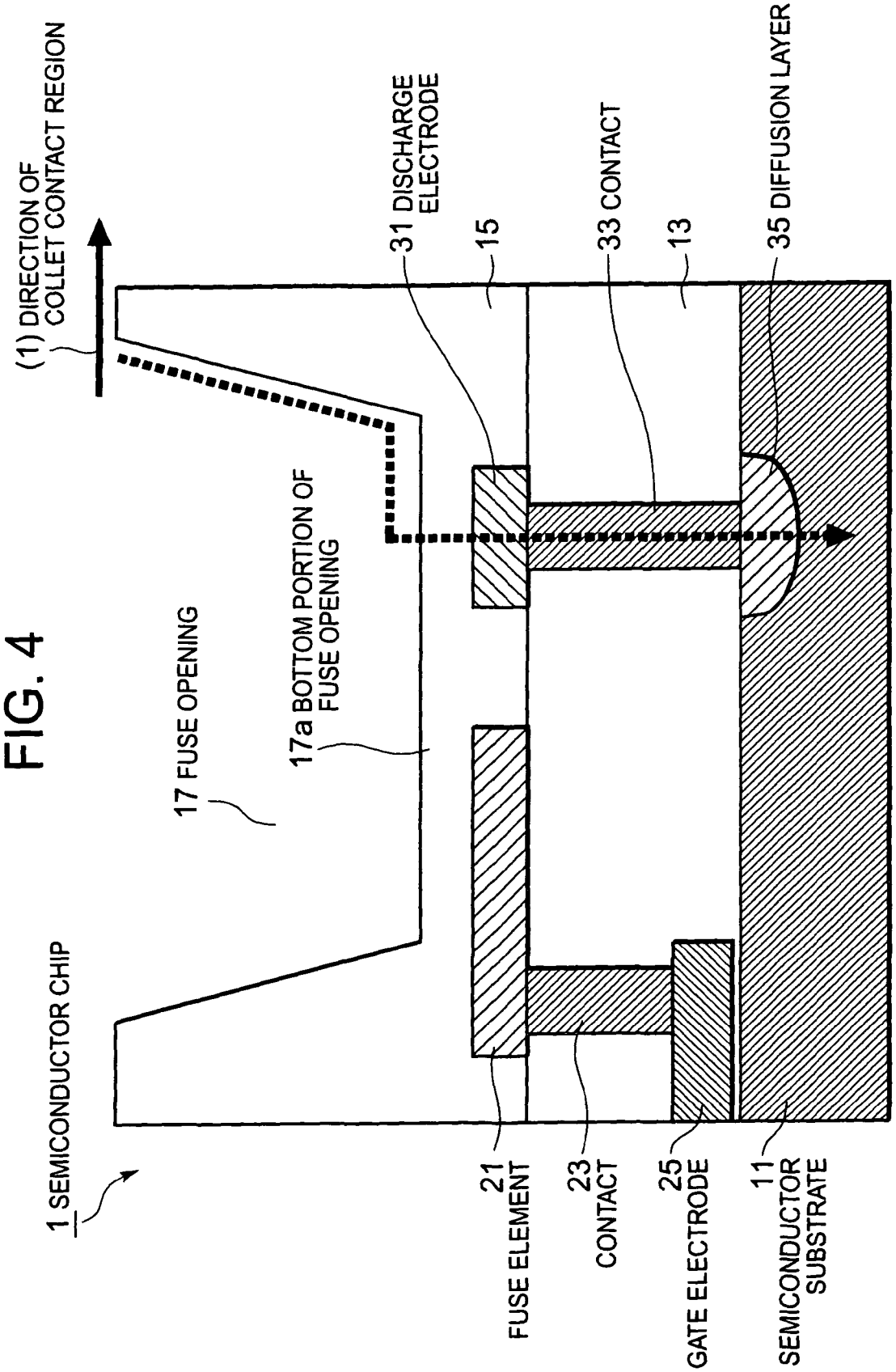
FIG. 4 is a diagram showing a discharge path obtained during a process of sucking the main part of the semiconductor chip shown in FIG. 2.

Next, with reference to FIGS. 3 and 4, description is given of a state of a semiconductor device according to Embodiment 1 of the present invention during a process of sucking the chip diced at the time of assembling the semiconductor device. In FIGS. 3 and 4, a discharge path is indicated by the bold dashed arrow. FIG. 3 is a diagram showing a discharge path obtained during the process of sucking the semiconductor chip 1 shown in FIG. 1. In FIG. 3, the discharge electrode 31 is formed in the discharge electrode forming region 130 which is positioned closer to the collet contact region 140 than the fuse forming region 120. Accordingly, the discharge path reaches the discharge electrode forming region 130 which is positioned closer to the collet contact region 140 than the fuse forming region 120. FIG. 4 is a diagram showing a discharge path obtained during a process of sucking the main part of the semiconductor chip 1 shown in FIG. 2. The discharge electrode 31 and the semiconductor substrate 11 are connected to each other at the same potential, and the discharge electrode 31 is formed at a position closer to the collet contact region 140 than the fuse element 21. For this reason, the discharge is generated in the path through the discharge electrode 31 which is additionally provided in Embodiment 1 of the present invention, rather than in the discharge path through the fuse element 21.

Thus, the electrostatic discharge, which is generated in the process of sucking the chip diced at the time of assembling the semiconductor chip, is generated in the discharge path through the discharge electrode 31 rather than in the discharge path through the fuse element 21. As a result, it is possible to prevent a high voltage from being applied to the gate electrode 25 formed in the circuit for selecting a redundant circuit, and to prevent the corresponding portion from being broken down.

Embodiment 2

Figure 5:
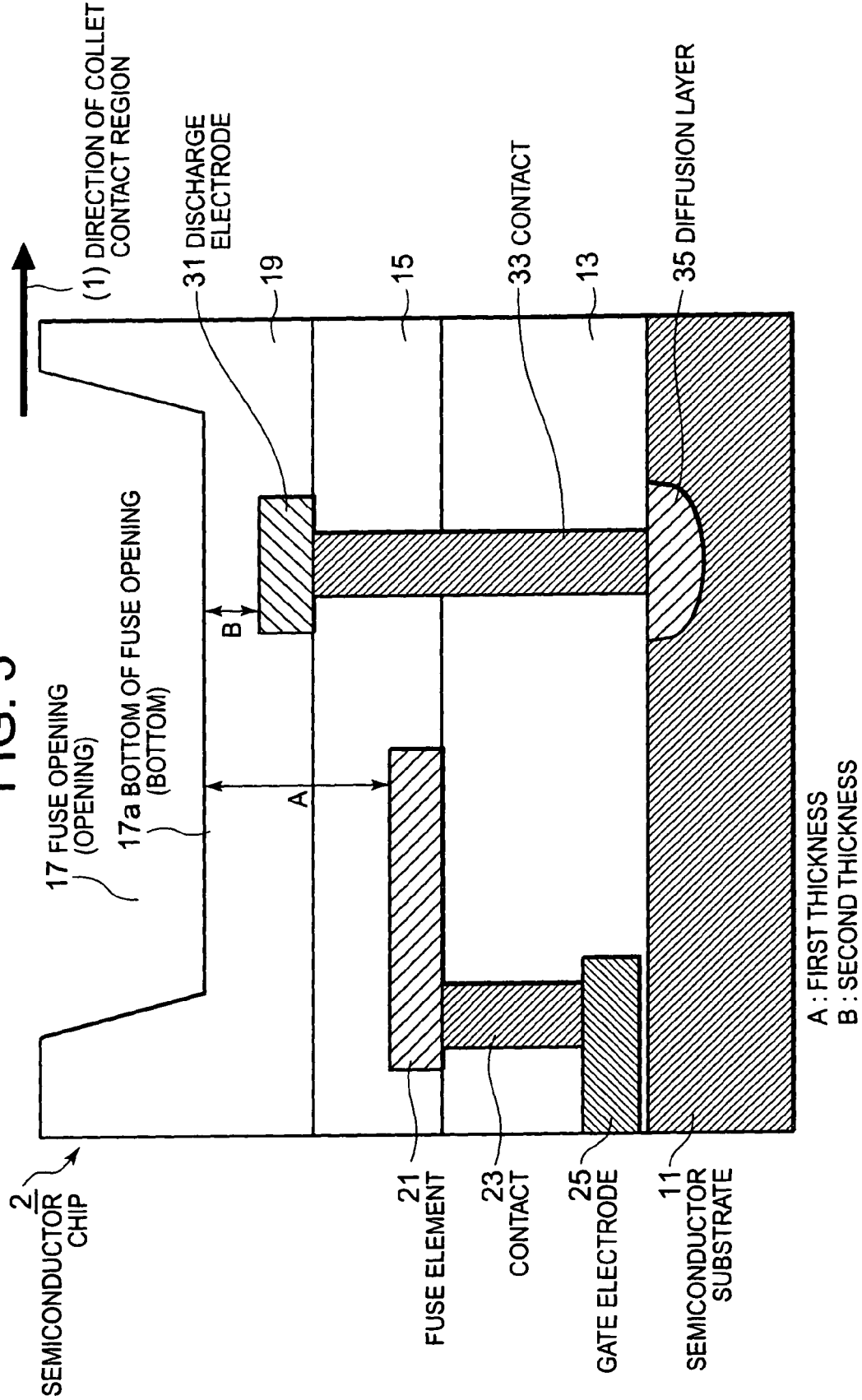
FIG. 5 is a cross-sectional diagram showing an example of a main part of a semiconductor chip according to Embodiment 2 of the present invention.

FIG. 5 is a cross-sectional diagram showing an example of a main part of a semiconductor chip according to Embodiment 2 of the present invention. Regions in which components are formed on a semiconductor chip 2 are the same as those of FIG. 1. In FIG. 5, the discharge electrode 31 is formed in a wiring layer which is formed on the layer in which the fuse element 21 is formed. Specifically, the semiconductor chip 2 shown in FIG. 5 includes the interlayer insulating films 13 and 15 and an interlayer insulating film 19, and includes the fuse opening 17 formed in the interlayer insulating film 19. The fuse element 21 is formed in the interlayer insulating film 15 in the same manner as in FIG. 2. The discharge electrode 31 is formed in the interlayer insulating film 19 which is formed on the insulating film 15. In other words, the discharge electrode 31 is formed in the layer which is formed on the layer in which the fuse electrode 21 is formed, and is formed below a bottom portion 17a of the fuse opening 17 in the same manner as in FIG. 2. The other components are the same as those of FIG. 2, so descriptions thereof are omitted. Note that, in the above embodiment, only an example of the relationship of the fuse element 21 and the discharge electrode 31 is illustrated, the discharge electrode 31 can overwrap a part of the fuse element 21 in a vertical direction of the semiconductor chip 2.

In the semiconductor chip 2 according to Embodiment 2 of the present invention, the discharge electrode 31 is formed as shown in FIG. 5, so a distance between the discharge electrode 31 and the bottom portion 17a of the fuse opening 17 (represented as distance B in FIG. 5) is shorter than a distance between the fuse element 21 and the bottom portion 17a (represented as distance A in FIG. 5). This is because a distance between the collet contact region 140 and the discharge electrode 31 is shorter than a distance between the collet contact region 140 and the fuse element 21. Accordingly, the current to be discharged from the collet is liable to reach the discharge electrode 31.

Thus, according to Embodiment 2 of the present invention, a thickness of an interlayer film formed on the discharge electrode 31 (which corresponds to distance B) is smaller than a thickness of an interlayer film formed on the fuse element 21 (which corresponds to distance A). Accordingly, the discharge path is more reliably guided to the discharge electrode 31 as compared with the case of Embodiment 1 of the present invention. Note that the case where the discharge electrode 31 is provided is illustrated as an embodiment with reference to FIG. 5, but any structure may be employed as long as such a discharge path can be ensured that prevents the fuse element 21 from discharging. For example, it is possible to provide a discharge path in such a manner that an opening is formed in the interlayer insulating layer 15 and a metal layer is embedded in the opening so that a current is discharged thereto. In other words, a conductive layer may be formed on and above a top surface of the fuse element 21. Further, if an electrical resistance value is in an allowable range, the contact 33 may be accumulated.

Figure 6:
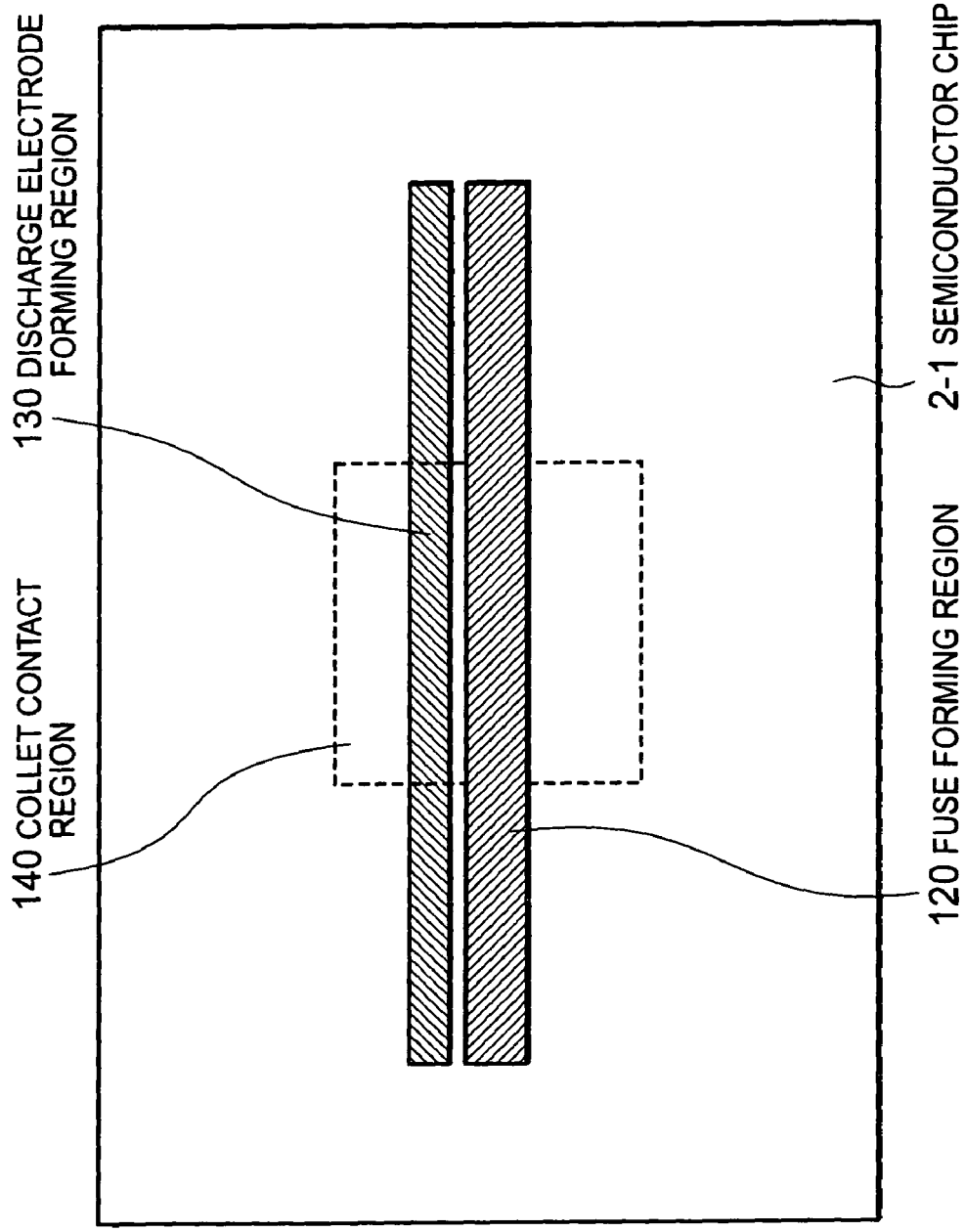
FIG. 6 is a plan diagram showing an example of regions in which components are formed on the semiconductor chip according to Embodiment 2 of the present invention.

Further, FIG. 6 shows another example of regions in which components are formed on a semiconductor chip. In FIG. 6, the collet contact region 140 is indicated by the dashed line. As shown in FIG. 6, the discharge electrode forming region 130 and the fuse forming region 120 are formed in parallel with each other at the substantial center of a semiconductor chip 2-1. The collet contact region 140 is overlapped with a part of the discharge electrode forming region 130 and with a part of the fuse forming region 120 equally. In this case, even when the fuse forming region 120 and the collet contact region 140 of the semiconductor chip 2-1 are overlapped with each other, the discharge electrode forming region 130 is also overlapped with the collet contact region 140 in the same manner. As a result, in the structure, the parasitic resistance component interposed between the semiconductor substrate 11 and the discharge electrode 31 is reduced as much as possible. Accordingly, the discharge current from the collet can be guided to the discharge electrode forming region 130. Further, the discharge electrode 31 is formed above the fuse element 21, thereby making it possible to guide the discharge current from the collet to the discharge electrode forming region 130.

Embodiment 3

Figure 7:
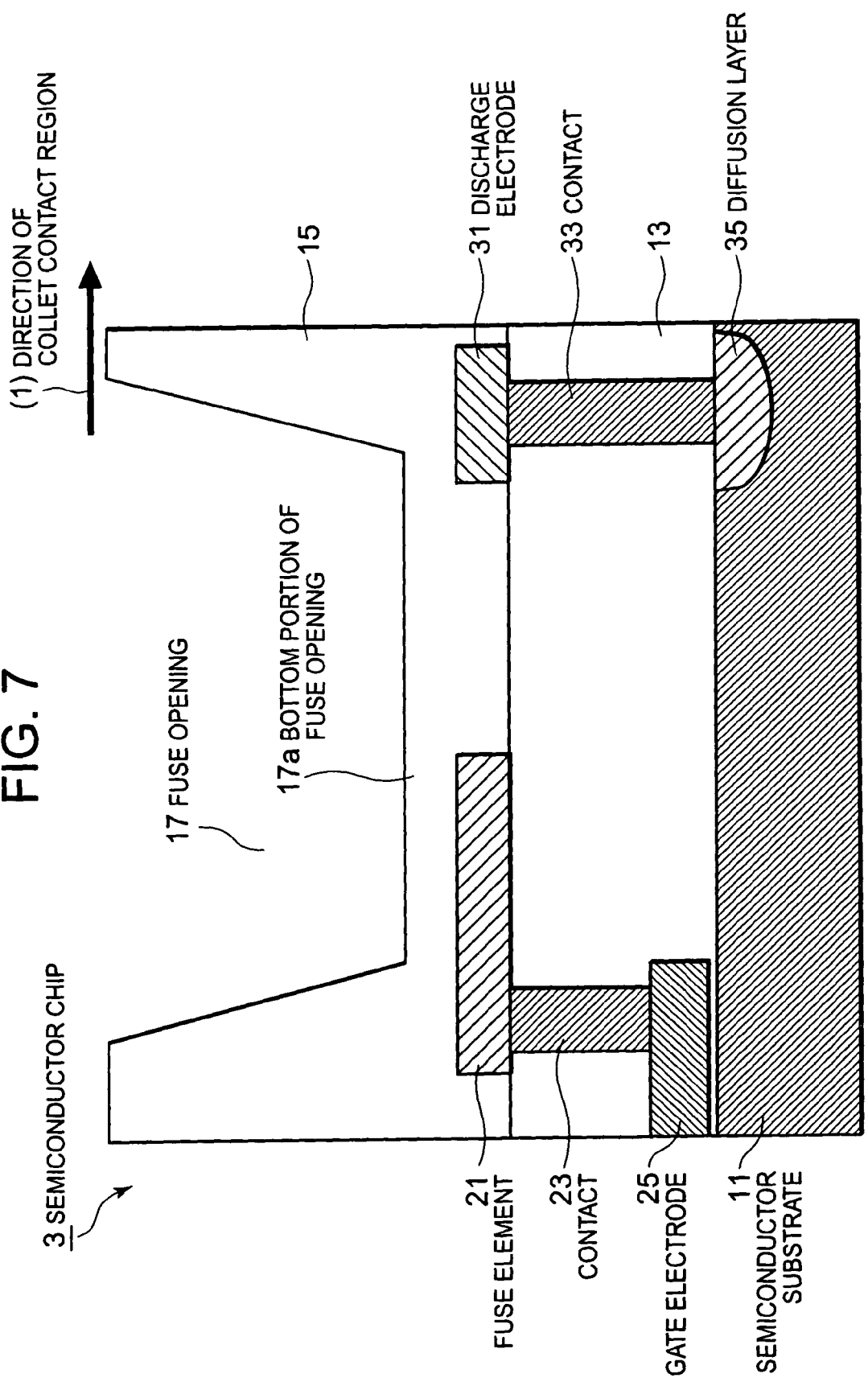
FIG. 7 is a cross-sectional diagram showing an example of a main part of a semiconductor chip according to Embodiment 3 of the present invention.

FIG. 7 is a cross-sectional diagram showing an example of a main part of a semiconductor chip according to Embodiment 3 of the present invention. In FIG. 7, the discharge electrode 31 is positioned at an edge of the fuse opening 17, and a part of the discharge electrode 31 is positioned below the bottom portion 17a of the fuse opening 17. Specifically, a part of the discharge electrode 31 is positioned on an inner side of the outer periphery of the bottom portion 17a of the fuse opening 17. Note that regions in which components are formed on a semiconductor chip 3 are similar to those of FIG. 1.

According to Embodiment 3 of the present invention, in a constant area of the bottom portion 17a of the fuse opening 17, the distance between the discharge electrode and the fuse electrode can be increased. A part of the discharge electrode 31 is positioned below the fuse opening 17, so the resistance component is not increased on the discharge path through the discharge electrode 31. In that structure, effects similar to those of the above embodiments are not impaired. Accordingly, the distance between the discharge electrode and the fuse electrode is increased without impairing the effects similar to those of the above embodiments. As a result, it is possible to increase an allowance for preventing problems in that, for example, the fuse element, which is fused at the time of fusing the fuse element by laser irradiation, is deposited between the fuse element and the discharge electrode, or the laser irradiation affects the discharge electrode depending on energy of the laser irradiation or an irradiation position.

Embodiment 4

Figure 8:
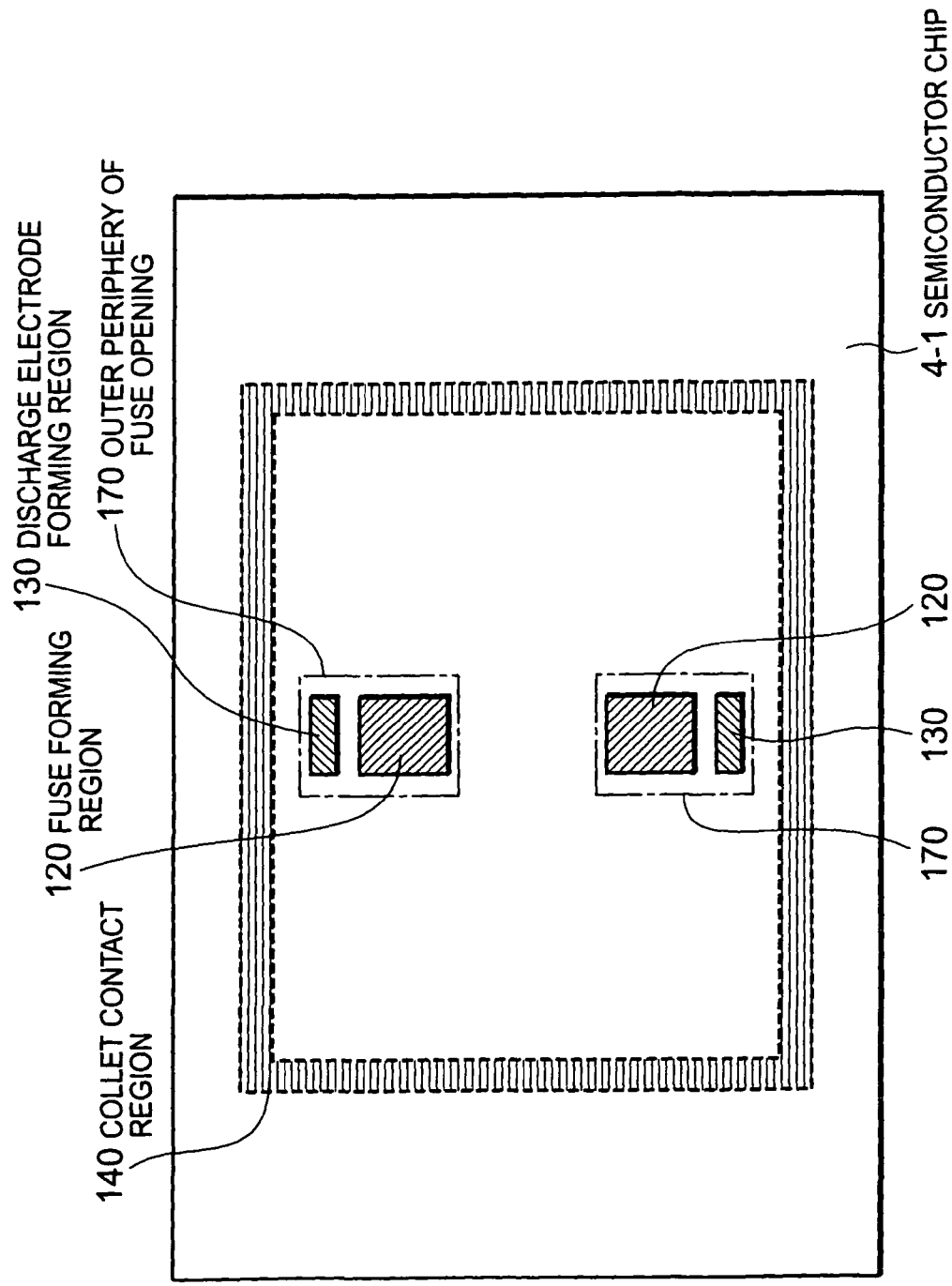
FIG. 8 is a plan diagram showing an example of regions in which components are formed on a semiconductor chip according to Embodiment 4 of the present invention.
Figure 9:
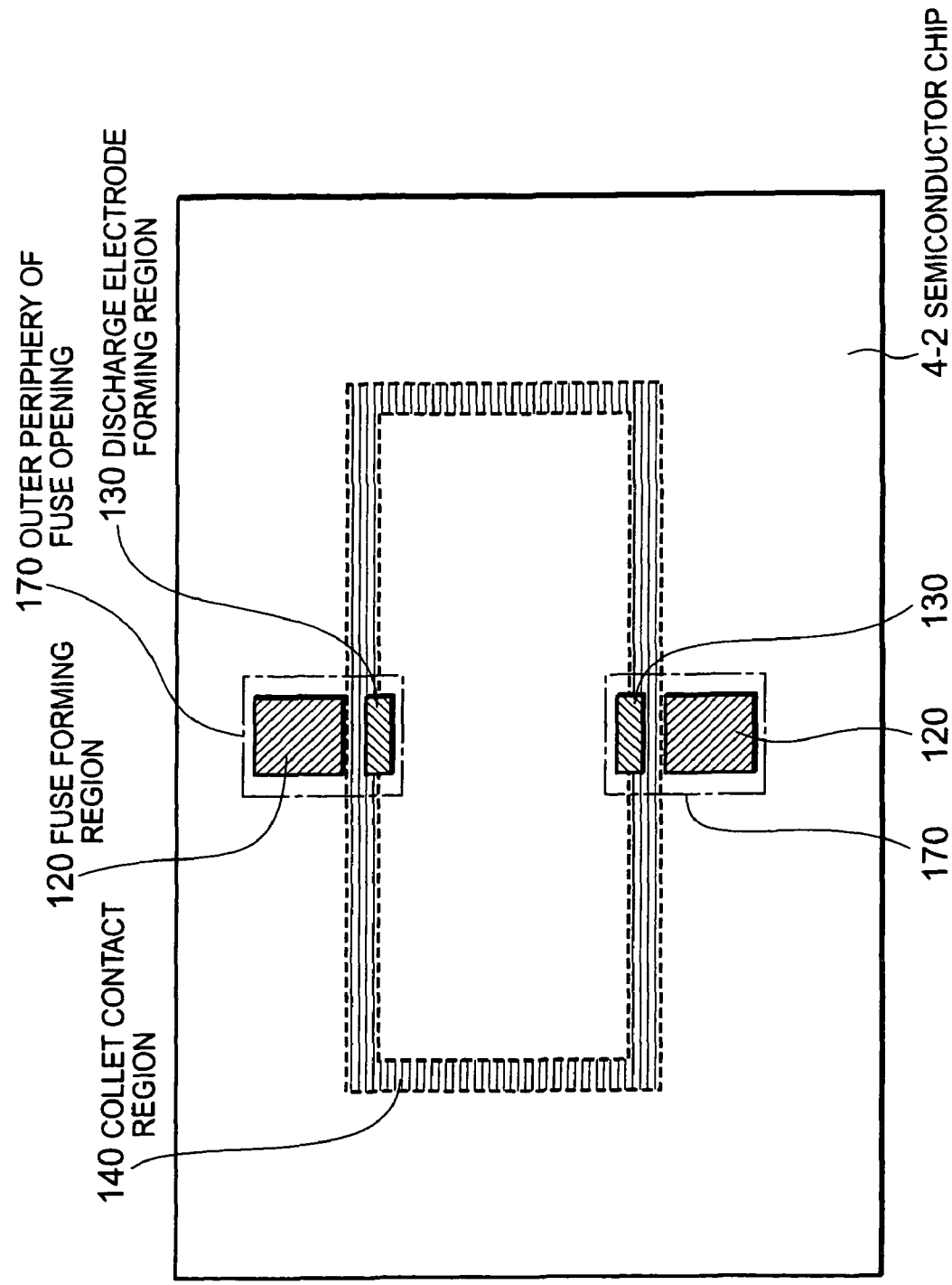
FIG. 9 is a plan diagram showing another example of the regions in which components are formed on the semiconductor chip according to Embodiment 4 of the present invention.

In Embodiment 4 of the present invention, description is given of a case where regions in which components are formed on a semiconductor chip are different from those of FIG. 1. FIGS. 8 and 9 are plan diagrams each showing examples of regions in which components are formed on semiconductor chips 4-1 and 4-2, respectively, according to Embodiment 4 of the present invention.

In FIG. 8, the fuse forming region 120, the discharge electrode forming region 130, and the outer periphery 170 of the fuse opening are positioned on an inner side of the collet contact region 140. In other words, the collet contact region 140 is positioned closer to the outer periphery of the semiconductor chip 4-1 than the fuse forming region 120. Accordingly, the discharge electrode forming region 130 (discharge electrode 31) is formed between the outer periphery of the semiconductor chip 4-1 and the fuse forming region 120 (fuse element 21). As a result, in the semiconductor chip 4-1 shown in FIG. 8, a distance between the collet contact region 140 and the discharge electrode forming region 130 is shorter than a distance between the collet contact region 140 and the fuse forming region 120.

Figure 10:
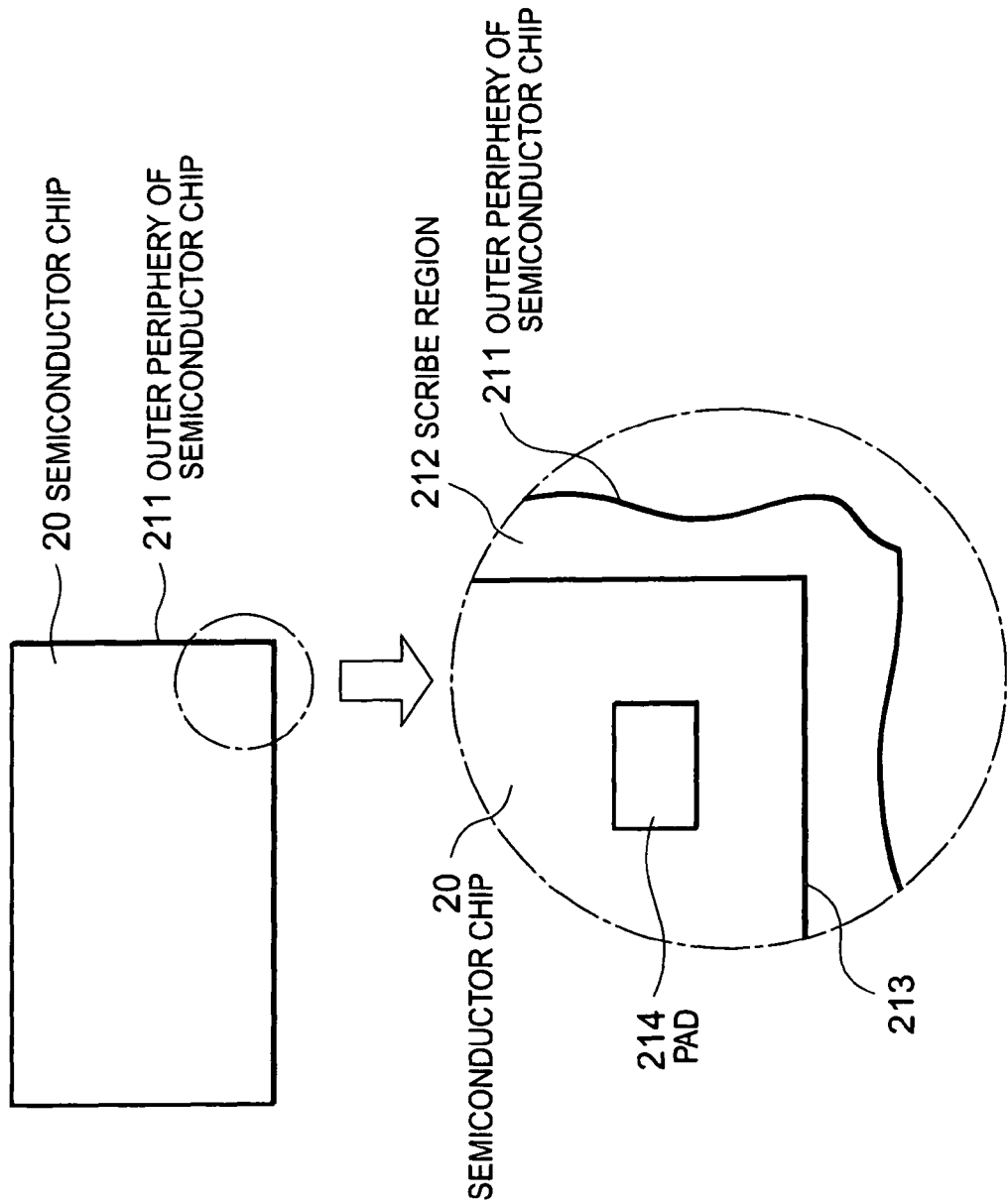
FIG. 10 is a partially enlarged view of an outer peripheral portion of a semiconductor chip.

Further, in the vicinity of the outer periphery (outer peripheral portion) of the semiconductor chip, a scribe region (scribe line) is formed. In general, a pad is formed on the outer periphery of the semiconductor chip in many cases excluding some products. Accordingly, it is preferable to determine the discharge electrode forming region 130 in consideration of that fact. FIG. 10 is a partially enlarged view of the vicinity of the outer periphery of the semiconductor chip. In a semiconductor chip 20 shown in FIG. 10, a scribe region 212 is formed on an inner side of an outer periphery 211 of the semiconductor chip. The discharge electrode forming region 130 is preferably formed on an inner side of the scribe region 212, that is, at a position closer to the center of the semiconductor chip than the scribe region 212. Specifically, the discharge electrode forming region 130 is formed on an inner side of a boundary line 213 of the semiconductor chip. Further, in a case where a pad 214 is formed in the vicinity of the outer periphery of the semiconductor chip 20, the discharge electrode forming region 130 is preferably formed at a position closer to the center of the semiconductor chip than the pad 214.

Further, in FIG. 9, the outer periphery 170 of the fuse opening is positioned so as to intersect with the collet contact region 140. In this case, it is necessary that the discharge electrode forming region 130 be formed at a position closer to the collet contact region 140 (apart of a region of semiconductor chip 4-2) than the fuse forming region 120. As a result, in the semiconductor chip 4-2 shown in FIG. 9, the distance between the collet contact region 140 and the discharge electrode forming region 130 is shorter than the distance between the collet contact region 140 and the fuse forming region 120.

Thus, according to Embodiment 4 of the present invention, even when the outer periphery 170 of the fuse opening is formed on the inner side of the collet contact region or formed so as to intersect with the collet contact region, the distance between the collet contact region 140 and the discharge electrode forming region 130 is set to be shorter than the distance between the collet contact region 140 and the fuse forming region 120, with the result that the current to be discharged from the collet can be easily caused to reach the discharge electrode 31.

Note that the example where the discharge electrode forming region 130 is overlapped with the collet contact region 140 is illustrated with reference to FIG. 9, but the present invention is not limited thereto. As illustrated in FIGS. 1 and 8, in some cases, there is provided a sufficient space between the fuse forming region 120 and the discharge electrode forming region 130, and the collet contact region 140 is not overlapped with the discharge electrode forming region 130. For example, there is a case where the collet contact region 140 is formed between the fuse forming region 120 and the discharge electrode forming region 130. In this case, in each of the semiconductor chips 4-1 and 4-2, the discharge electrode forming region 130 may be formed such that the distance between the collet contact region 140 and the discharge electrode forming region 130 becomes shorter than the distance between the collet contact region 140 and the fuse forming region 120.

Further, in Embodiment 4 of the present invention, as shown in FIGS. 2 and 5, the discharge electrode 31 may be formed below the bottom portion 17a of the fuse opening 17, and may be formed in the layer in which the fuse element 21 is formed or in the layer formed on the layer in which the fuse element 21 is formed. As shown in FIGS. 3 and 8, the whole of or a part of the discharge electrode 31 may be formed on the inner side of the outer periphery 170 of the fuse opening (outer periphery of bottom portion 17a).

Embodiment 5

Figure 11:
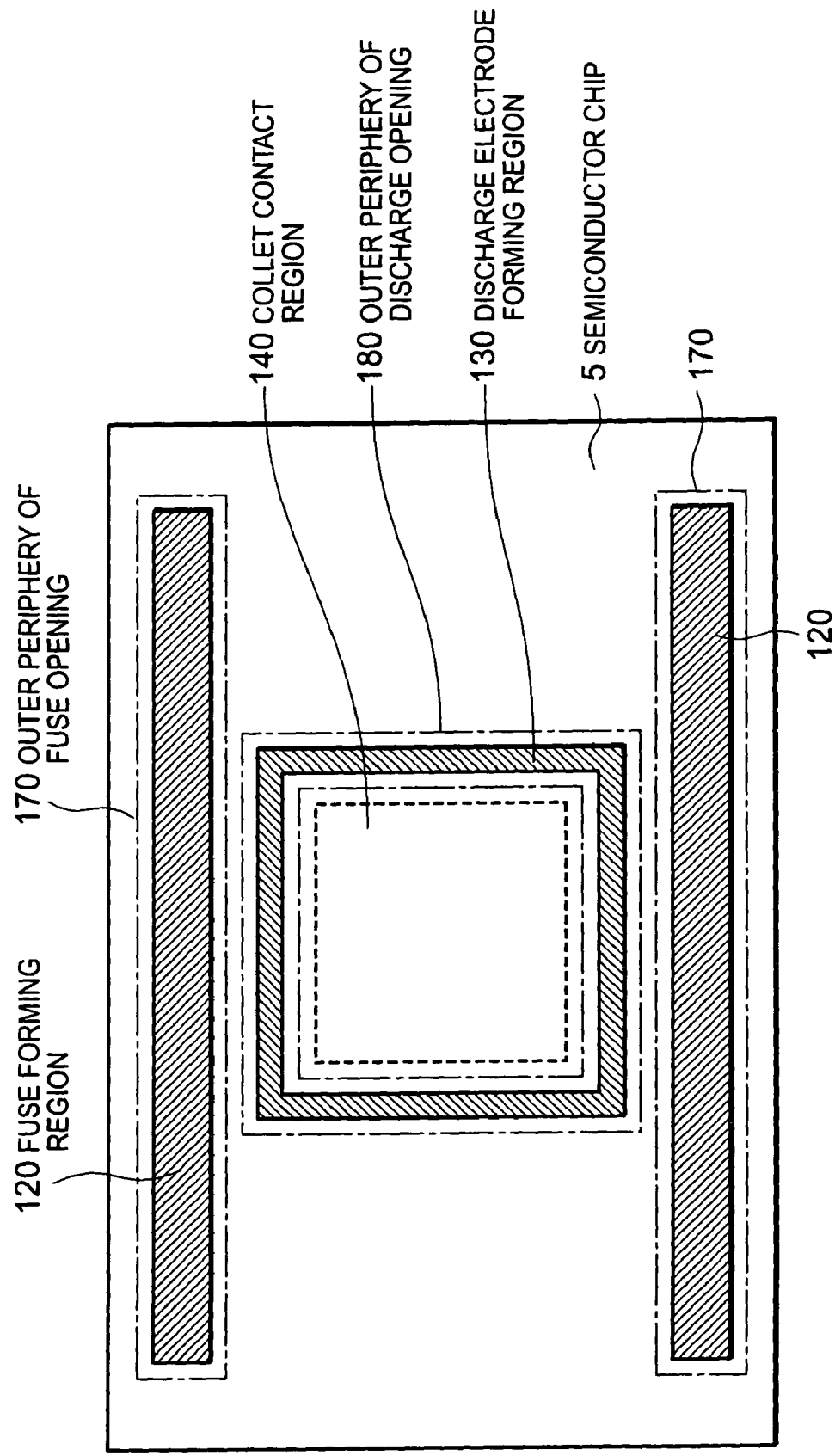
FIG. 11 is a plan diagram showing an example of regions in which components are formed on a semiconductor chip according to Embodiment 5 of the present invention.

FIG. 11 is a plan diagram showing an example of regions in which components are formed on a semiconductor chip according to Embodiment 5 of the present invention. In FIG. 11, the collet contact region 140 is a region in the vicinity of the center of a semiconductor chip 5, which is indicated by the dashed line. The fuse forming regions 120 are formed in parallel with each other along two sides of the region near the outer periphery of the semiconductor chip 5. The outer periphery 170 of the fuse opening surrounds the fuse forming region 120. The discharge electrode forming region 130 is formed so as to surround the collet contact region 140. Further, another opening (hereinafter, referred to as "discharge opening"), which is different from the fuse opening 17, is formed, and an outer periphery 180 of the discharge opening is formed so as to surround the discharge electrode forming region 130.

Figure 12:
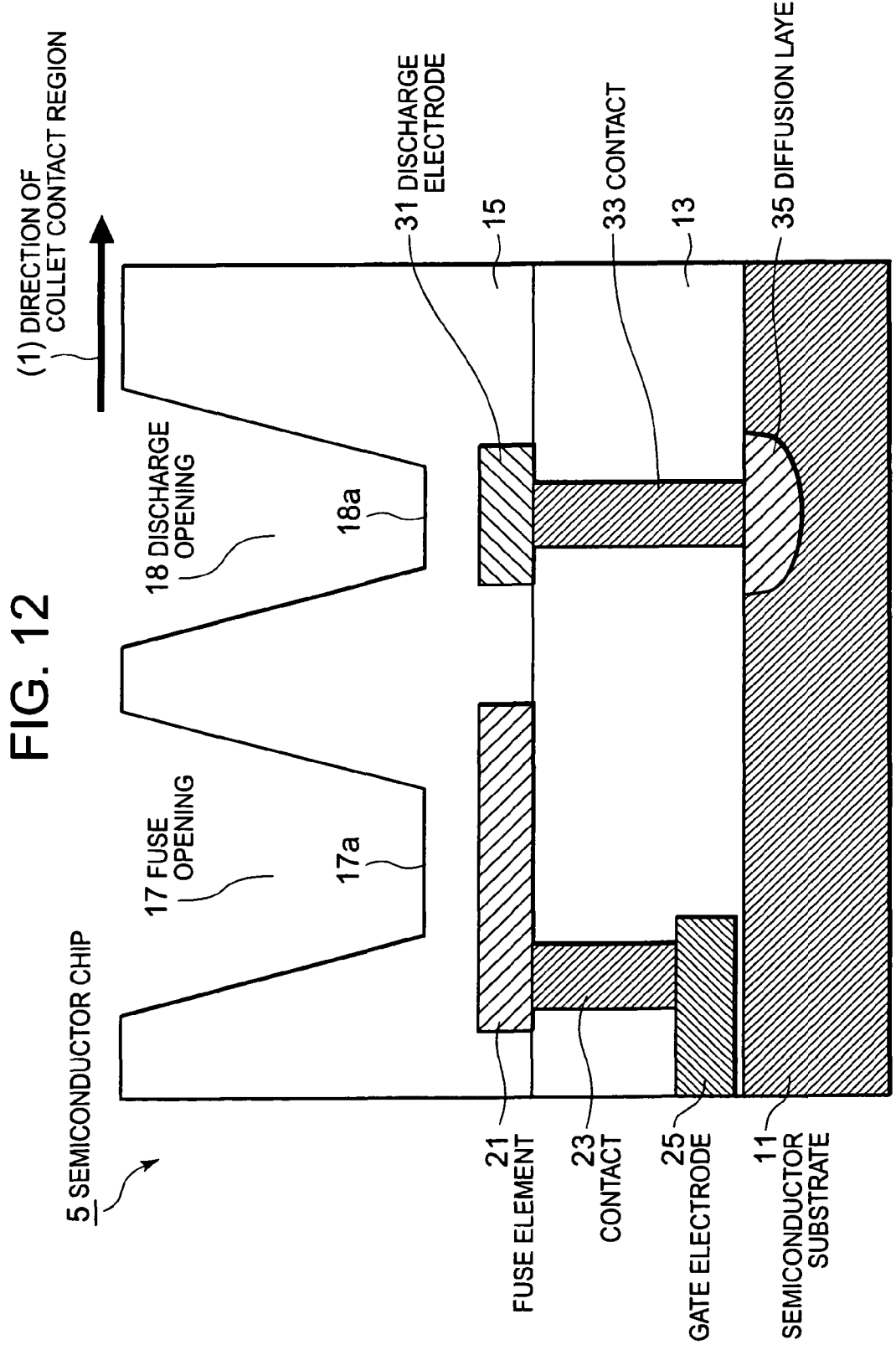
FIG. 12 is a cross-sectional diagram showing an example of a main part of the semiconductor chip according to Embodiment 5 of the present invention.

FIG. 12 is a cross-sectional diagram showing an example of a main part of the semiconductor chip according to Embodiment 5 of the present invention. The semiconductor chip 5 shown in FIG. 12 has the fuse opening portion 17 formed in the interlayer insulating film 15, and has a discharge opening 18 formed above the discharge electrode 31. The other components are the same as those of FIG. 2, so descriptions thereof are omitted. In FIG. 12, the discharge electrode 31 is formed so as to be adjacent to the fuse element 21, and the discharge electrode 31 is positioned below the discharge opening 18 which is formed separately from the fuse opening 17 formed above the fuse element 21.

Figure 13:
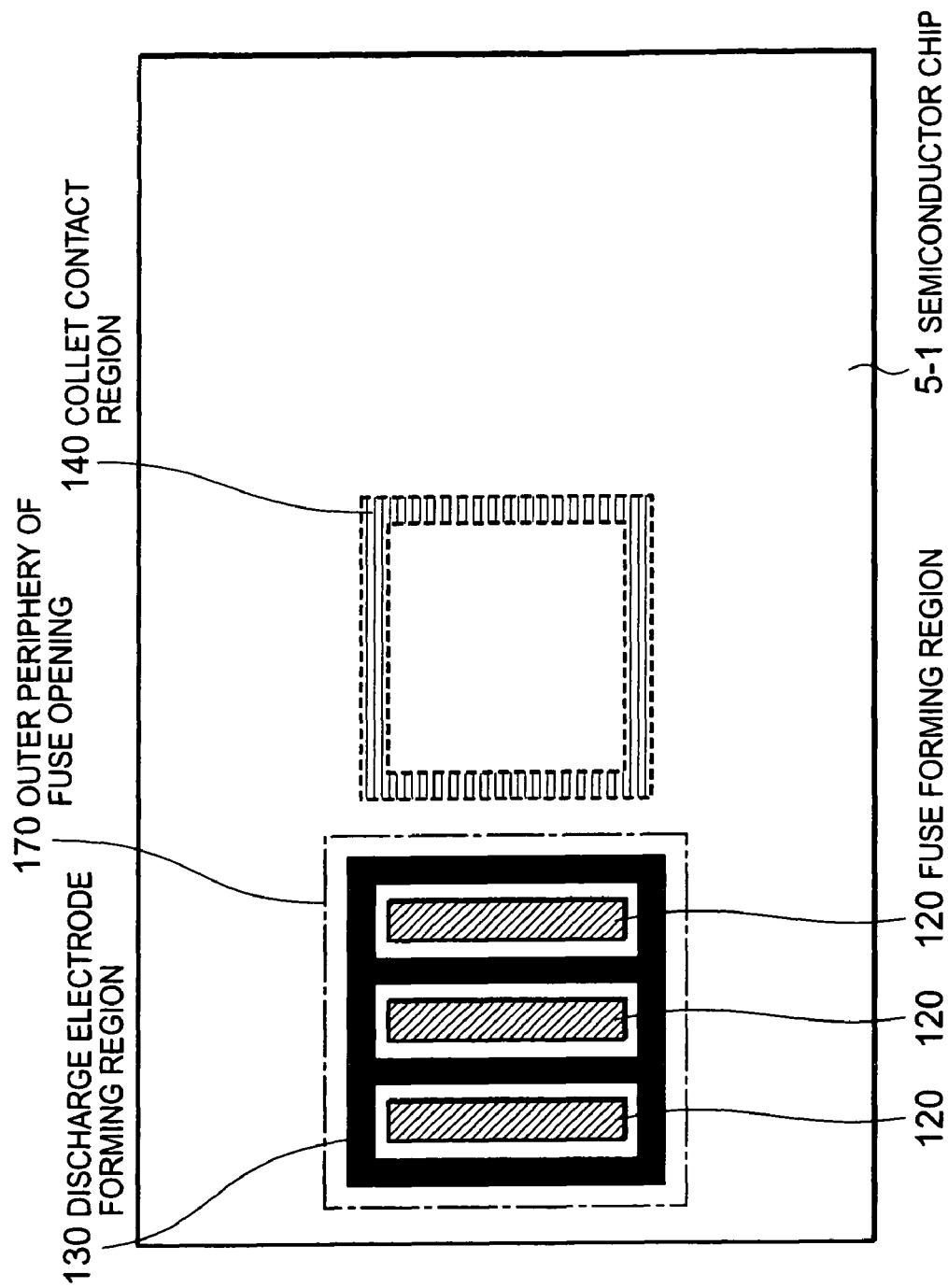
FIG. 13 is a plan diagram showing an example of regions in which components are formed on the semiconductor chip according to Embodiment 5 of the present invention.

Further, FIG. 13 is a plan diagram showing an example of the regions in which components are formed on the semiconductor chip according to Embodiment 5 of the present invention. In FIG. 13, the discharge electrode forming region 130 is indicated by a black solid region. As shown in FIG. 13, a plurality of fuse forming regions 120 are each surrounded by the discharge electrode forming region 130, thereby blocking the path for the current to be discharged from the collet so that the current does not reach the fuse element 21. In FIG. 13, a single fuse opening 17 is provided, but different fuse openings 17 may be provided for each of the fuse elements 21.

Figure 14:
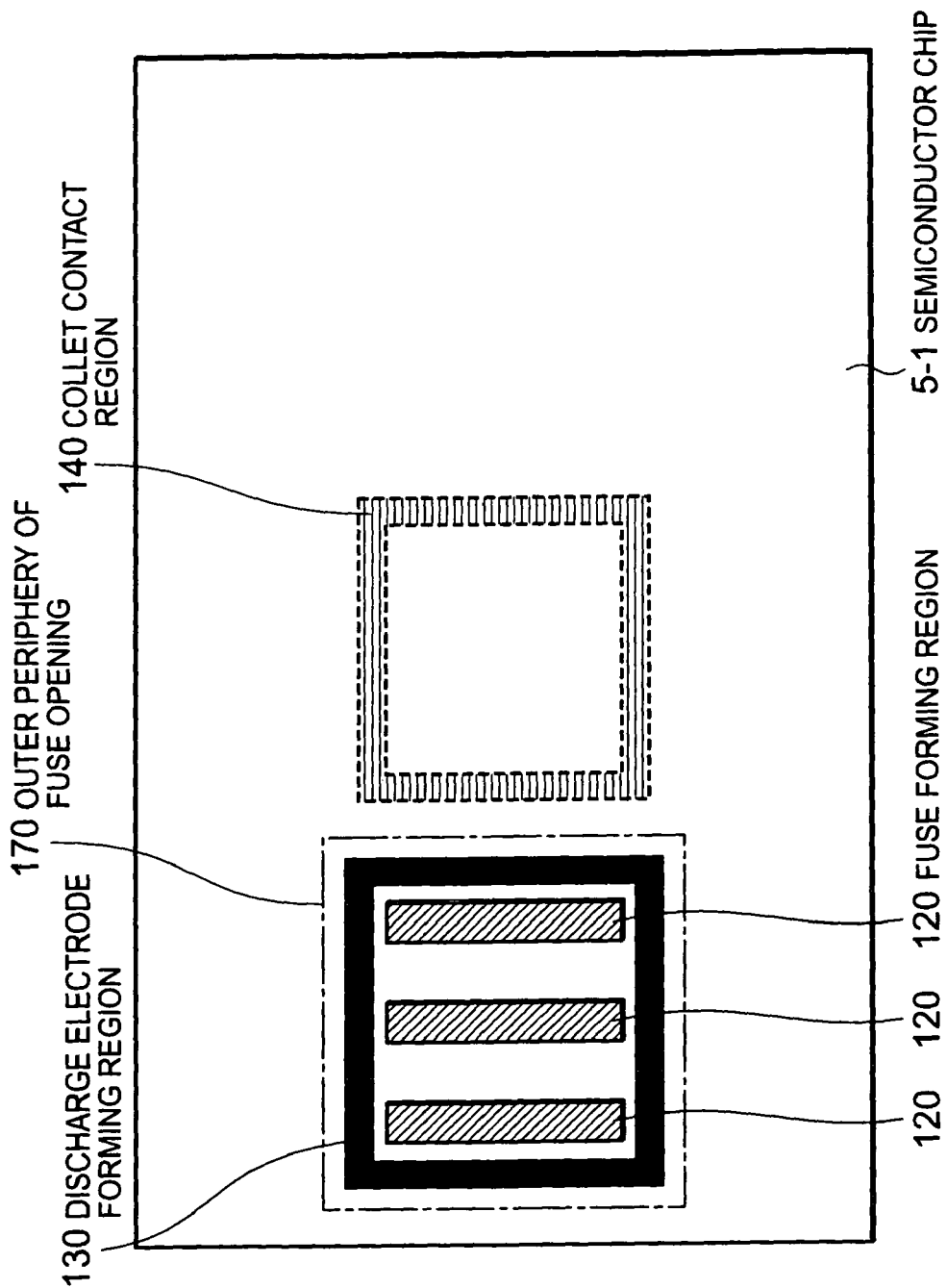
FIG. 14 is a plan diagram showing another example of the regions in which components are formed on the semiconductor chip according to Embodiment 5 of the present invention.
Figure 15:
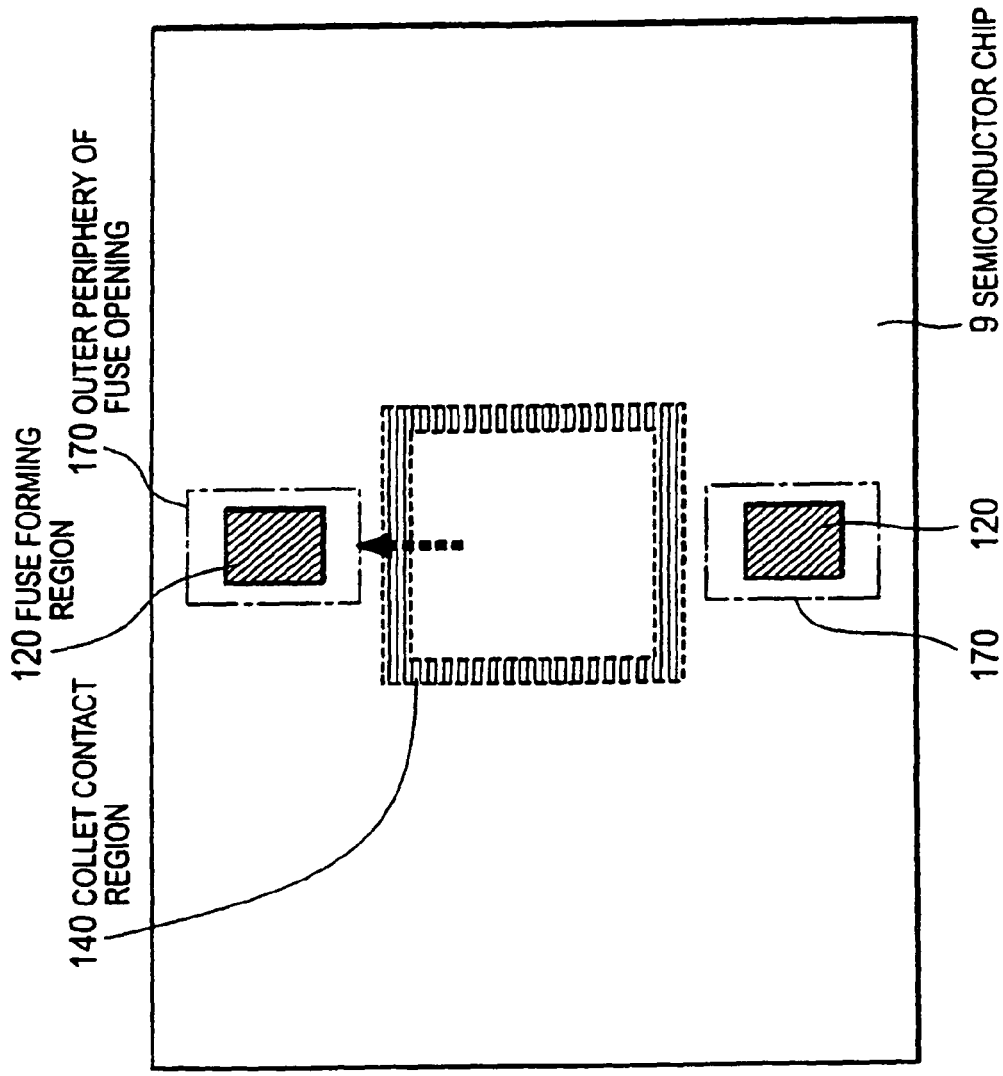
FIG. 15 is a plan diagram showing regions in which components are formed on a semiconductor chip of a related art.
Figure 16:
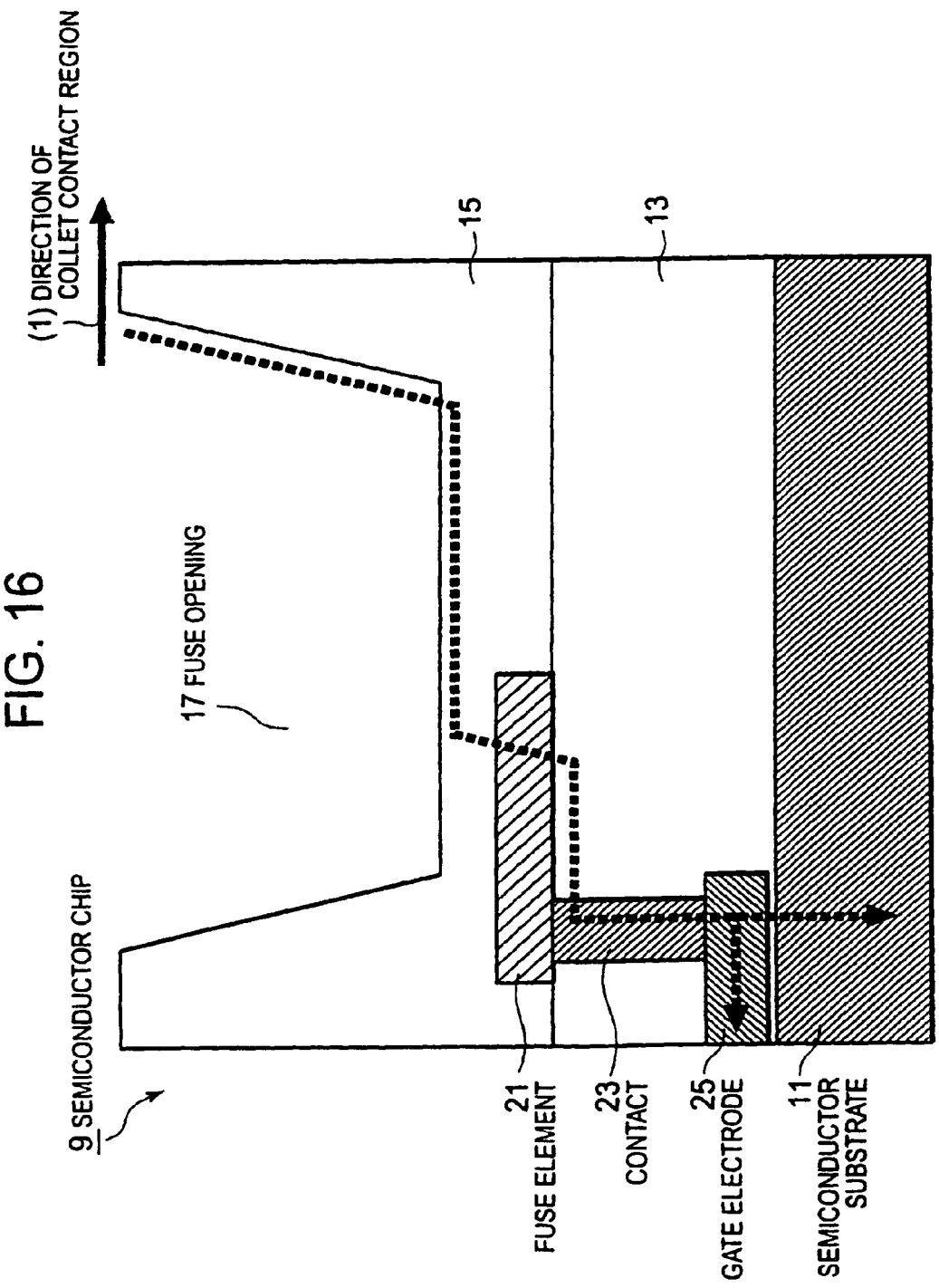
FIG. 16 is a cross-sectional diagram showing a main part of the semiconductor chip of the related art.

The example where a plurality of fuse forming regions 120 are each surrounded by the discharge electrode forming region 130 is illustrated with reference to FIG. 13, but the discharge electrode forming region 130 may be formed along the inside of the fuse opening as shown in FIG. 14. FIG. 14 is a plan diagram showing another example of the regions in which the components are formed on the semiconductor chip according to Embodiment 5 of the present invention. Also in FIG. 14, the discharge electrode forming region 13 is indicated by a black solid region. As shown in FIG. 14, the discharge electrode forming region 130 is formed so as to surround fuses inside an inner frame of the outer periphery 170 of the fuse opening. In other words, the discharge electrode forming region 130 is formed so as to surround the fuse forming regions 120 (a plurality of fuse forming regions 120 are grouped together in FIG. 14) inside the outer periphery 170 of the fuse opening (inside the bottom portion of the fuse opening). In FIG. 14, the discharge electrode forming region 130 is formed along the inside of the outer periphery 170 of the fuse opening, but the arrangement of discharge electrode forming region 130 is not limited thereto. As long as the discharge electrode forming region 130 is formed inside the outer periphery 170 of the fuse opening and is formed so as to surround the fuse forming regions 120, the current caused to flow due to the electrostatic discharge reaches the discharge electrode. Note that the example where the discharge electrode forming region 130 is surrounds three of fuse elements 120 in the FIG. 14, a center of the fuse elements is surrounded two sides by the discharge electrode and both side of the fuse elements are surrounded three sides by the discharge electrode. In addition, the discharge electrode forming region 130 completely surrounds the fuse region 140 is illustrated with reference to FIG. 14, but the present invention is not limited thereto. The discharge electrode forming region 130 can be arranged to surround a part of fuse elements, for example the discharge electrode is formed to "C" shape.

Thus, according to Embodiment 5 of the present invention, the discharge electrode forming region is formed so as to surround the collet contact region 140 as shown in FIG. 11. As a result, the current to be discharged from the collet can be reliably guided to the discharge electrode 31. In addition, the discharge opening 18, which is different from the fuse opening 17, is formed, thereby making it possible to more reliably guide the discharge current from the collet to the discharge electrode 31. Further, at the constant distance between the fuse element 21 and the discharge electrode 31, the fuse element 21 and the discharge electrode 31 are formed below the fuse opening 17 and the discharge opening 18, respectively. Accordingly, it is possible to increase an allowance for preventing a problem in that the fuse element 21, which is fused at the time of fusing the fuse element 21 by laser irradiation, is deposited between the fuse element 21 and the discharge electrode 31.

Note that, in FIG. 12, the whole of the discharge electrode 31 is positioned below the bottom portion 18a of the discharge opening 18. Alternatively, a part of the discharge electrode 31 may be positioned below the bottom portion 18a of the discharge opening 18. Also in the region in which the semiconductor chips shown in FIGS. 1, 8, and 9 are each formed, the discharge opening 18 can be formed in addition to the fuse opening 17 as shown in FIG. 12. As a result, the discharge current is liable to be guided to the discharge electrode 31.

As described above, according to the exemplary embodiments of the present invention, the discharge electrode 31 is formed so as to block the discharge path which allows the discharge current to flow from the collet contact region 140 to the fuse element 21, and the discharge electrode 31 is formed below the fuse opening 17, and is formed in the layer in which the fuse element 21 is formed or in the layer formed on the layer in which the fuse element 21 is formed. Accordingly, the semiconductor chip includes the discharge electrode 31 which is formed in the same layer as the wiring layer in which the fuse element 21 is formed, or in the layer formed on the wiring layer, in a region which is positioned keeping a shorter distance to the portion to be brought into contact with the collet (collet contact region 140) in the process of sucking the chip diced at the time of assembling the semiconductor chip, than the distance between the collet contact portion and the fuse element 21. At least a part of the discharge electrode 31 is formed in the fuse opening 17, and is connected to the semiconductor substrate 11 at the same potential. Accordingly, the discharge current from the collet can be prevented from reaching the fuse element 21.

As a result, it is possible to prevent the current, which is caused to flow due to the electrostatic discharge generated in the process of assembling the semiconductor device, from being discharged through the fuse element 21, and to prevent a functional failure from occurring in the semiconductor chip. In addition, with the structure of the present invention, at the time of electrostatic discharge, even when the collet contact region 140 is positioned closer to the fuse forming region 120, the current is discharged through the path between the discharge electrode 31 and the semiconductor substrate 11, in which there are less resistance components. For this reason, it is possible to obtain effects of preventing the current from being discharged through the fuse element 21 and the circuit for selecting a redundant circuit connected to the fuse element 21, as a discharge path, and preventing an operational failure from occurring in the semiconductor chip.

Further, in a case of providing, in the circuit for selecting a redundant circuit, a protection element for protecting the circuit against the discharge generated through the fuse element and the circuit for selecting a redundant circuit connected to the fuse element, as a discharge path, there are disadvantages in that the area of the protection element is increased, which results in increase of the size of the chip. This is because there are provided a large number of circuits for selecting a redundant circuit, and several hundreds to several thousands of the circuits are generally provided in units of fuse elements for each chip. However, as a result of the formation of the discharge electrode 31 as described in the above embodiments, it is possible to prevent a functional failure from occurring in the semiconductor chip, which is caused by the discharge current caused to flow through the fuse element 21 due to the electrostatic discharge generated in the process of assembling the semiconductor device, without increasing the size of the chip.

Moreover, in the protection element of the related art, the protection element and an element to be protected are electrically connected to each other. Accordingly, in a case where the protection element is broken down, even when the element to be protected is not broken down, the functions of the semiconductor chip are affected in some cases because of an increase in resistance and disconnection of a current path due to a leak current generated in the protection element and destruction of the protection element. Such a failure can be prevented by forming the discharge electrode 31 as described in the above embodiments.

Further, only a small number of regions, which are additionally provided in the exemplary embodiments of the present invention, are required for a plurality of fuse elements 21, in a unit of square region having sides of several µm, thereby having almost no effect on the chip area. In addition, even when a certain breakdown phenomenon occurs in the protection element due to the electrostatic discharge, the protection element and the element to be protected are not electrically connected to each other, so there is no effect on the functions of the semiconductor chip.

In the above embodiments, the discharge electrode 31 is formed in the interlayer insulating film which is formed below the bottom portion 17a of the fuse opening 17. As a result, the discharge electrode 31 is not exposed to the outside. Accordingly, contamination such as oxidation of the discharge electrode 31 can be prevented.

Note that, in the above embodiments, only an example of the collet contact region 140 is illustrated, since the collet contact region 140 varies depending on a device to be used in the process of assembling the semiconductor device. Further, only examples of the shape and the forming region of each of the fuse element 21, the fuse opening, the discharge electrode 31, the discharge opening, and the like shown in the drawings are illustrated in the above embodiments. Positions of the fuses to be formed may be determined in combination of the above embodiments according to the number of components to be formed as a matter of course, and the present invention is not limited thereto.

What is claimed is:

1. A semiconductor chip comprising:
   a fuse element;
   an insulating film formed over said fuse element;
   an opening formed in said insulating film, said opening having a bottom; and
   discharge electrode formed below said bottom,
   wherein the discharge electrode is formed at a position closer to a carrying region of said chip than the fuse element, said chip being movable when carried at said carrying region.

2. The semiconductor chip according to claim 1 wherein a part of the discharge electrode is formed at an area inside of an outer periphery of said bottom.

3. The semiconductor chip according to claim 1 wherein the discharge electrode is formed between a central portion of the semiconductor chip and the fuse element.

4. The semiconductor chip according to claim 1 wherein the discharge electrode is formed between an outer periphery of the semiconductor chip and the fuse element.

5. The semiconductor chip according to claim 4, wherein the discharge electrode is formed between said opening and a scribe region.

6. The semiconductor chip according to claim 4, wherein the discharge electrode is formed between said opening and a region in which a pad is formed.

7. The semiconductor chip according to claim 1 wherein:
   the fuse element and the discharge electrode are formed above a semiconductor substrate; and
   the discharge electrode is connected to the semiconductor substrate through a contact.

8. The semiconductor chip according to claim 1 wherein said discharge electrode is formed in one of the same layer as the fuse element and a layer above the fuse element.

* * * * *